(12) United States Patent
Ko

(10) Patent No.: US 6,943,119 B2
(45) Date of Patent: Sep. 13, 2005

(54) FLASH PROCESS FOR STACKING POLY ETCHING

(75) Inventor: May-Ho Ko, Hsin-Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/724,784

(22) Filed: Dec. 1, 2003

(65) Prior Publication Data

US 2005/0116280 A1 Jun. 2, 2005

(51) Int. Cl.⁷ .......................................... H01L 21/304
(52) U.S. Cl. ................. 438/694; 438/230; 438/585; 438/669; 438/696; 438/710; 438/761; 438/778; 438/798
(58) Field of Search ................ 438/230, 283, 438/585, 669, 694, 696, 710, 761, 778, 798, 438/FOR 120, FOR 388, FOR 393

(56) References Cited

U.S. PATENT DOCUMENTS

| 5,924,011 | A | * | 7/1999 | Huang .................... 438/655 |
| 6,033,950 | A | * | 3/2000 | Chen et al. ................ 438/239 |
| 6,103,621 | A | | 8/2000 | Huang .................... 438/652 |
| 6,103,622 | A | | 8/2000 | Huang .................... 438/652 |
| 6,165,375 | A | | 12/2000 | Yang et al. .................. 216/67 |
| 6,165,861 | A | | 12/2000 | Liu et al. .................... 438/382 |
| 6,297,528 | B1 | * | 10/2001 | Chen et al. ................ 257/311 |
| 6,586,299 | B1 | * | 7/2003 | Tsai ........................ 438/238 |
| 2002/0173150 | A1 | * | 11/2002 | Kawai et al. .............. 438/690 |
| 2004/0121545 | A1 | * | 6/2004 | Chen et al. ................ 438/266 |

* cited by examiner

Primary Examiner—George Fourson
Assistant Examiner—Joannie Adelle Garcia

(57) ABSTRACT

In accordance with the objectives of the invention a new Method and recipe is provided for etching of stacked layers of polysilicon. The invention provides for an added flash step after the conventional Overall Etch (OE).

26 Claims, 3 Drawing Sheets

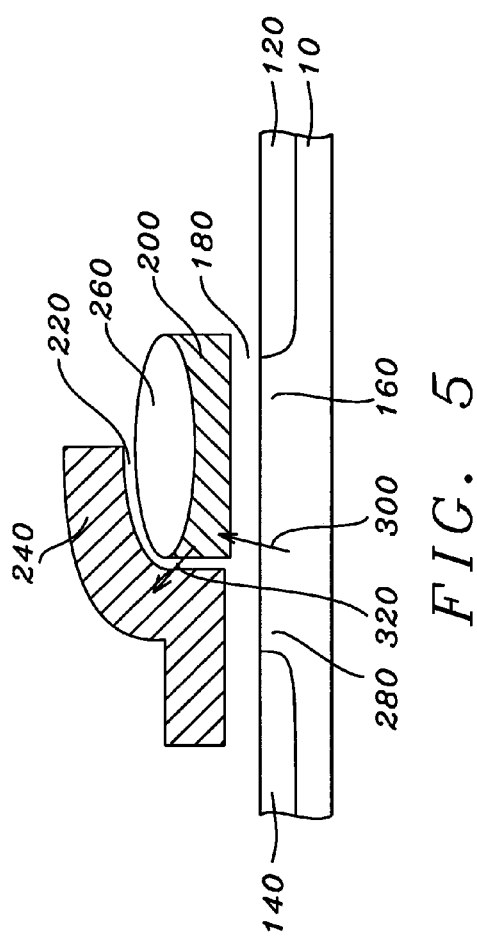
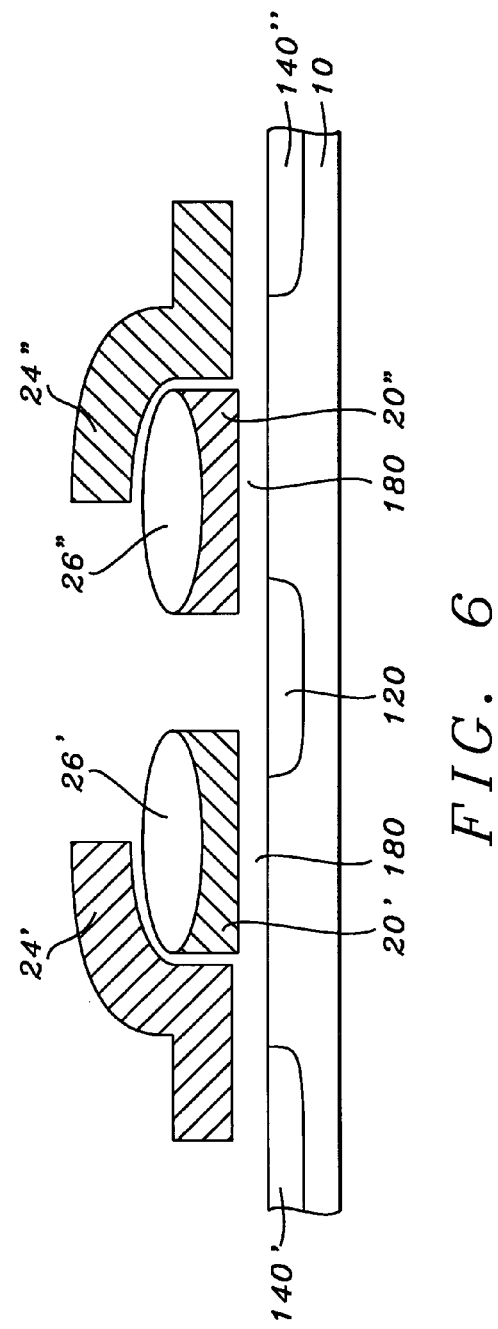

US 6,943,119 B2

FLASH PROCESS FOR STACKING POLY ETCHING

BACKGROUND OF THE INVENTION

1. Field of the Invention

The invention relates to the fabrication of integrated circuit devices, and more particularly, to a method of etching layers of polysilicon on a mixed-mode processing environment. The method provides for the removal of poly-2 residue from sidewalls of a poly-1 pattern while device Isat performance and mixed-mode product yield are improved.

2. Description of the Prior Art

The fabrication of semiconductor devices requires the application of numerous interdependent technical disciplines which are collectively applied in a high-speed, cost-competitive semiconductor manufacturing facility.

To enhance the competitive nature of creating semiconductor devices and to further enhance the performance characteristics of these devices, a number of semiconductor devices are of a mixed-mode design in which both analog and digital circuits are created on the same chip.

Device performance is further improved by increasing device density, since this approach reduces the interconnect and the distance between other functional elements of the device while at the same time allowing for the creation of a larger number of active devices in or on the surface of one substrate.

It is obvious that device yield is a critical parameter in creating semiconductor devices since device yield is directly related to the cost of the created devices. From this is it obvious that a continuous effort is made to increase the device yield while at the same time maintaining or improving device performance characteristics.

More specifically, in the creation of 0.35 $\mu$m mixed mode semiconductor devices, two overlying layers of polysilicon are frequently used for as an example the creation of flash memory EEPROM devices, which use a double poly structure whereby the upper poly forms the control gate and the word lines of the structure while the lower poly is the floating gate. In a typical structure, the control-gate poly overlaps the channel region that is adjacent to the channel under the floating gate. The extension of the control gate over the channel region is referred to as the series enhancement-mode transistor and is required because when the cell is erased, a positive charge remains on the floating gate inverting the channel under floating gate. The series enhancement-mode transistor prevents the flow of current from the source to the drain regions of the MOS device.

Device performance improvements are typically achieved by reducing device dimensions, which further enables increased packaging density of the created semiconductor devices. It is therefore desirable to create memory devices over smaller surface regions of the substrate. One of the frequently applied methods for the creation of etched layers of poly, that are part of a split gate flash memory device, is the use of a hardmask layer that overlies a layer of poly that needs to be etched.

The invention address concerns and aspects of creating stacked or overlying layers of polysilicon and, more specifically, concerns of poly-2 residue over sidewalls of patterned underlying poly-1.

U.S. Pat. No. 6,165,375 (Yang et al.) claims a flash step in an etch process.

U.S. Pat. No. 6,165,861 (Liu et al.) shows a method for a mixed mode product.

U.S. Pat. No. 6,103,622 (Huang) and U.S. Pat. No. 6,103,621 (Huang) show processes for mixed mode products using poly etches.

SUMMARY OF THE INVENTION

A principal objective of the invention is to provide a method for the creation of stacker layers of polysilicon such that no upper layer residue is present on sidewalls of a patterned lower layer of polysilicon.

Another objective of the invention is to provide a method of creating stacked layers of polysilicon such that the Isat performance of semiconductor devices that are created with the stacked layers of polysilicon is enhanced.

Yet another objective of the invention is enhance yield of mixed-mode created semiconductor devices that comprise stacked patterned layers of polysilicon.

A still further objective of the invention is to remove low Isat device performance as a yield detractor for mixed-mode semiconductor devices.

In accordance with the objectives of the invention a new method and recipe is provided for etching of stacked layers of polysilicon. The invention provides for an (added) flash step after the conventional Overall Etch (OE). This flash step is combined with applying zero bias power and high source power, which combination results in the complete removal of poly-2 residue even for high P.D. mixed-mode devices. The flash step further desirably increase Isat from 0.2 mA to 0.6 mA, thus removing the Isat parameter as a yield detractor and making the yield independent of the device parameters (Critical Dimension or CD) and of the thickness of inter-poly oxide (IPO).

BRIEF DESCRIPTION OF THE DRAWINGS

FIG. 5 shows a cross section of a floating gate and a control gate of a conventional split-gate flash memory cell.

FIG. 6 shows a cross section of a conventional split-gate flash memory cell having two control gates overlying two floating gates.

DESCRIPTION OF THE PREFERRED EMBODIMENTS

Conventionally, in the creation of mixed-mode semiconductor devices, low Isat performance of the created devices that comprise stacked layers of patterned polysilicon, has been a random but significant yield detractor.

It has been found, an observation which increases in its severity of impact if the device density increases, that the patterned layer of polysilicon-2 has a high topography, which makes a satisfactory patterning of the layer of polysilicon-2 difficult the control. The poly-2 is etched before subsequent steps of Lightly Doped Diffusion (LDD) source/drain impurity implantations into the substrate.

Due to the topography of the deposited layer of poly-2, having a significant difference between the height of the high and the low points of the deposited layer of poly-2, and the subsequent difficult to control etch of this layer, the etched layer of poly-2 will have a severe and negative impact on the quality of the LDD source/drain impurity implants.

It has been found that a major contributor to the latter negative impact is poly-2 residue that remains in place over sidewalls of the patterned layer of poly-1. This poly-2 residue is the direct cause of poor LDD source/drain implantations and of a low value of Isat of the subsequently created gate electrodes, using the patterned layers of poly-1 and poly-2.

In order to improve the above highlighted negative aspects of poor LDD impurity implantation and low Isat performance, the poly-2 residue must be removed from the sidewalls of the patterned poly-1.

It has in this respect been found that there is a direct correlation between the pattern density (P.D.) of the poly-1 and the residue of poly-2 that remains in place over sidewalls of the patterned poly-1. Higher poly-1 P.D. will result in increased formation of poly-2 residue over sidewalls of the patterned poly-1.

Figure 1:
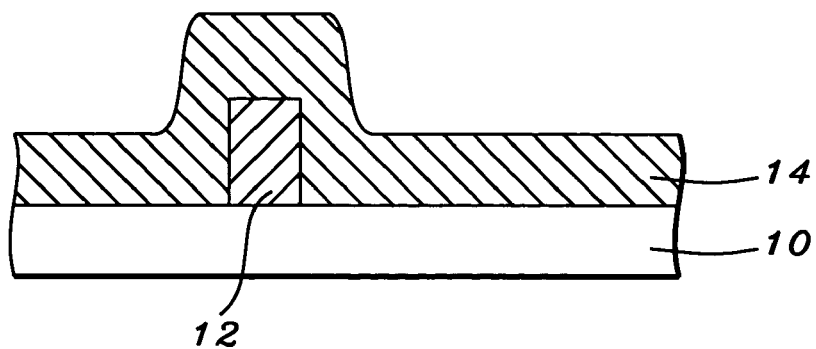
FIG. 1 is a cross section of a semiconductor substrate over which a patterned first layer and a second layer of polysilicon have been deposited.

FIG. 1 shows a cross section of a semiconductor substrate 10 over which a patterned layer 12 of poly-1 has been created, using conventional methods of photolithographic exposure and development.

A layer 14 of poly-2 has been deposited over substrate 10, the (high) topography of layer 14 is apparent from the cross section shown in FIG. 1.

Figure 2:
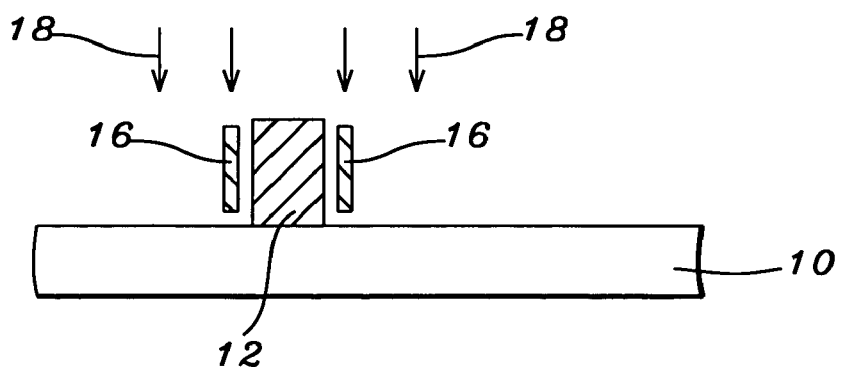
FIG. 2 is the cross of the substrate after the second layer of polysilicon has been etched.

After patterning of layer 14, the results of which are shown in the cross section of FIG. 2, deposits 16 of poly-2 conventionally remain in place over the sidewalls of patterned layer 12 of poly-1. It is clear that these poly-2 residues 16 interfere with the LDD implant 18, which is self-aligned with patterned layer 12 and of which the impurity implants must be controlled, especially where these implants are in the immediate vicinity of patterned layer 12, which is, as the cross section of FIG. 2 highlights, the areas where residues 16 most severely interfere with impurity implants 18.

As highlighted above, residues 16 further causes low Isat performance of the devices that are created using gate electrode 12.

A number of parameters are in effect during the etch of layer 14 of poly-2, the main parameters are essentially:
  a Break Through etch (BT)
  a Main Etch (ME), and
  an Over Etch (OE).

A number of experiments have been conducted, leading to the conclusions of the invention.

For the etching of the layer 14 of poly-2 a number of processing conditions are applied, similar for instance to the etching of organic polymer, whereby anisotropic etching is applied using a parallel HDP chamber, using a gas containing $O_2$ at a flow rate of between about 10 and 40 sccm in a carrier gas of argon at a flow rate of between about 10 and 40 sccm. The flow rate of the carrier gas is adjusted to maintain a pressure of between about 1 and 10 mTorr in the reaction chamber, an rf power of between about 1,000 and 1,500 Watts is applied to the etching chamber.

The effect of varying the parameters that are conventionally applied for the etching of layer 14 has led to the conclusion that varying the participating parameters does not have an effect on the poly-2 residue over sidewalls of the patterned poly-1. For instance, varying source power from 250 Watts to 300 Watt during the OE step does not materially effect poly-2 residue deposition. Similarly, increasing the ME percentage of OE from 20% to 30% equally does not materially effect poly-2 residue deposition nor does increasing the EO time from 240 to 330 seconds.

Steps have been taken to reduce polymer formation and deposition, these steps also did not indicate any effect on the formation of poly-2 residue over sidewalls of the patterned poly-1.

The applied recipe has been varied in order to validate the impact of the native oxide effect on the formation of poly-2 residue, from this it has been concluded that poly-2 residue is not stimulated or induced by the presence of native oxide.

Further experiments have been directed at determining the effect of Pattern Density. From these experiments it has been concluded that poly-1 P.D. may have an impact on the formation of poly-2 residue. Poly-2 residue increases as the P.D. for poly-1 is increased.

Figure 3:
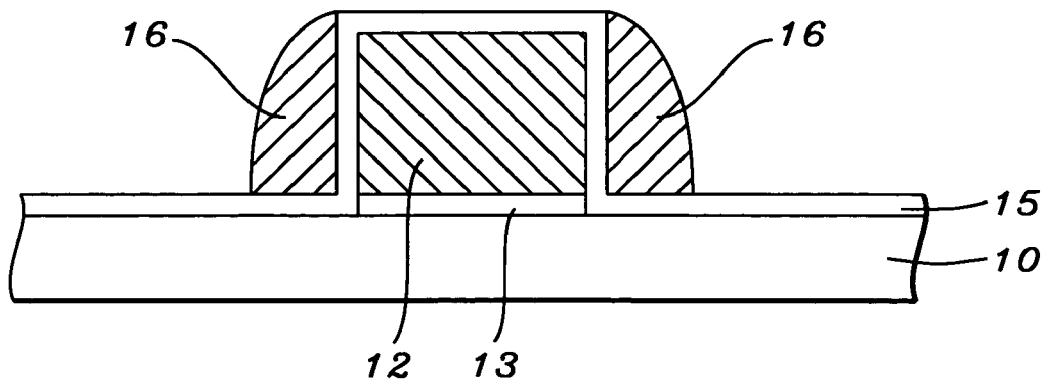
FIG. 3 shows a cross section of a gate electrode formed over a substrate with there-with associated elements.

These and other aspects of the invention are highlighted using the cross section of FIG. 3, wherein in addition to the previously highlighted elements are shown a layer 13 of gate oxide and a layer 15 of Inter-Poly Oxide (IPO). The following observations apply to the cross section that is shown in FIG. 3:

1. a high poly-2 etch is used to protect the IPO layer 15 from overetch after poly-2 endpoint detection, that is poly-23 etch-through has been reached
2. this high poly-2 etch makes it difficult to remove all the poly-2, highlighted as layer 16 in the cross section of FIG. 3, from the sidewalls of patterned poly-1 layer 12
3. if the poly-1 P.D. is high, more poly-2 spacers will be present over sidewalls of patterned poly-1 layer 12 after ME
4. the poly-2 spacers 16 will be covered with polymer during OE since this step tends to create a high polymer count
5. it has been shown to be of no value to increase the OE time with the objective of preventing or removing the poly-2 residue 16, shown in cross section in FIG. 3.

The invention has solved the above highlighted problems, created by the formation of poly-2 residue over sidewalls of patterns layers of poly-1, by providing a new flash step and by making use of the following observations:
  no value is derived from using a low power source during the new flash step of the invention
  the formed poly-2 residue is attacked if the flash step is implemented after the ME step, this only for limited applications of 0.35 $\mu$m CD product, making this application not attractive
  the poly-2 residue will be successful removed by application of a high-power flash step after the OE step; this is the preferred solution of the invention.

Figure 4:
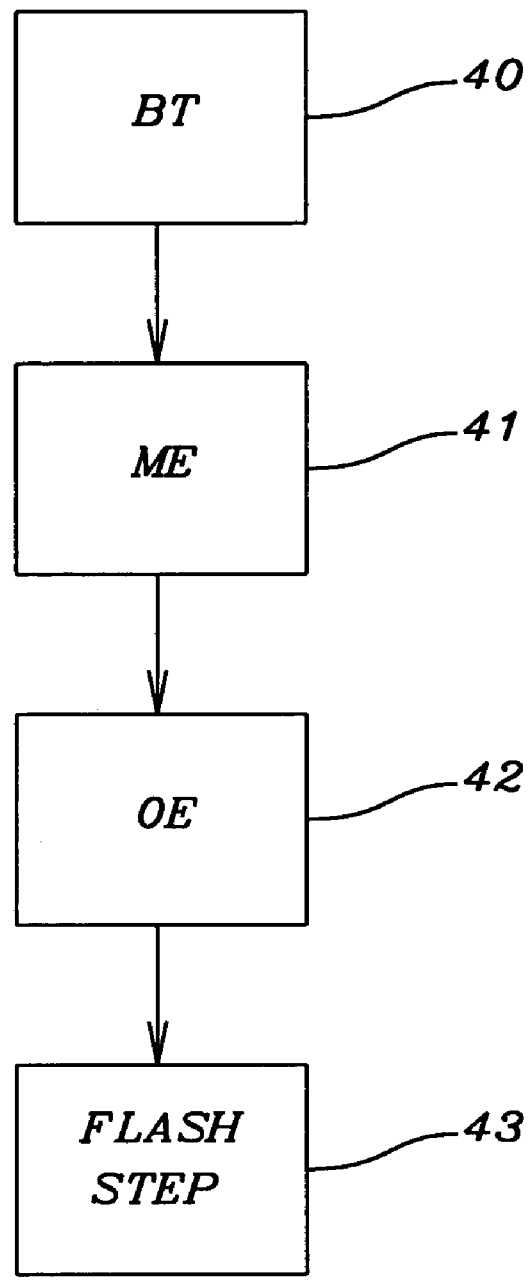
FIG. 4 shows a flowchart of the processing steps of the invention for etching a layer of poly-2.

The processing conditions of the final etch-recipe for etching the layer 14 of poly-2, comprising steps BT-ME-OE-flash step, as provided by the invention is as follows:
  BT, FIG. 4, step 40: a pressure of between about 3 and 5 mTorr, source power between about 200 and 300 Watt, bias power between about 100 and 200 Watt, etchant gas $Cl_2$ supplied at between about 80 and 100 sccm, applied for a time of between about 8 and 12 seconds
  ME, FIG. 4, step 41: a pressure of between about 5 and 7 mTorr, source power between about 200 and 300 Watt, bias power between about 100 and 200 Watt, etchant gas $Cl_2$ supplied at between about 25 and 35 sccm with HBr supplied at between about 80 and 100 sccm with an OE of about 15%
  OE, FIG. 4, step 42: a pressure of between about 50 and 70 mTorr, source power between about 200 and 300 Watt, bias power between about 150 and 220 Watt, etchant gas HBr supplied at between about 150 and 250 sccm with He supplied at about 80 to 120 sccm, with He—$O_2$ supplied at between about 3.0 and 3.0 sccm The new and additional flash step, FIG. 4, step 43: a pressure of between about 50 and 70 mTorr, source power between about 100 and 200 Watt, etchant gas $SF_6$ supplied at between about 40 and 60 sccm with He supplied at about 150 to 250 sccm, applied for between about 10 and 20 sec.

The invention, which provides method for creation of stacked layers of polysilicon, can be summarized as follows:

providing a substrate, at least one pattered first layer of polysilicon having been created over the substrate depositing a second layer of polysilicon over the substrate, thereby including the at least one pattered first layer of polysilicon, and etching the second layer of polysilicon, thereby removing remnants of the second layer of polysilicon from sidewalls of the at least one pattered first layer of polysilicon.

Alternately, the invention, which provides for the stacked layers of polysilicon for creation of mixed-mode semiconductor devices, can be summarized as follows:

providing a substrate creating a layer of gate oxide over the surface of the substrate depositing a first layer of gate material over the layer of gate oxide patterning and first etching the layer of first gate material depositing a layer of inter-polysilicon dielectric material over the surface of the substrate, thereby including exposed surfaces of the first etched layer of first gate material depositing a second layer of gate material over the surface of the layer of inter-polysilicon dielectric material, and patterning and second the second layer of gate material.

The cross sections that are shown in FIGS. 5 and 6 highlight practical applications of the invention. These practical applications show the creation of overlying layers of polysilicon and will be briefly discussed following.

The cross section that is shown in FIG. 5 is a conventional flash-memory cell in which a double-polysilicon (poly) structure is applied. A MOS transistor is formed on a semiconductor substrate 10 having a first doped region 120, also referred to as a Vss source region, a second doped region 140, also referred to as a drain region, a channel region 160, a layer 180 of gate oxide, a floating gate 200, a layer 220 of inter-gate dielectric and a control gate 240. Substrate 10 and channel region 160 have a first conductivity type, the first doped region 120 and the second doped region 140 have a second conductivity type that is opposite the first conductivity type of the substrate 10.

As seen in FIG. 5, the first doped region 120 is provided in the surface of the substrate 10. The second doped region 140 is also provided in the surface of the substrate 10 and is spaced apart from the first doped region 120. The channel region 160 is in the surface of substrate 10 and is located between the first and the second doped regions, 120 and 140 respectively. Gate oxide layer 180 overlies the substrate 10. The floating gate 200, to which there is no direct electrical connection and which overlies the substrate 10, is separated from the substrate 10 by a thin layer 180 of gate oxide. The control gate 240, to which there is direct electrical connection, is generally positioned over the floating gate 200 with intergate oxide 220 provided between the floating gate 200 and the control gate 240.

The surface of the floating gate 200 has been highlighted as surface 260. Surface 260 typically is a layer of poly-oxide that has been formed over the surface of layer 200 of floating gate material by oxidizing the layer of semiconductor material 200, such as polysilicon, that has been deposited for the creation of the floating gate 200, using methods of photolithography and exposure to expose layer 200 over surface area 260.

In the structure shown in FIG. 5, control gate 240 overlaps the channel region 280, which is adjacent to channel 160 underneath the floating gate 200. This structure is needed because when the cell is erased, a positive charge is retained on the floating gate 200. As a result, the channel 160 under the floating gate 200 becomes inverted. The series MOS transistor (formed by the control gate 240 over the channel region 160) is needed in order to prevent current flow from the control gate 240 to the floating gate 200. The length of the transistor, that is the overlap 280 of the control gate 240 over the channel region 160, determines the cell performance.

To program the transistor shown in FIG. 5, which shows the placement of a gate voltage Vg, a source voltage Vs and a drain voltages Vd, charge is transferred from substrate 10, through gate oxide 180 and is stored on floating gate 200 of the transistor. The amount of charge is set to one of two levels to indicate whether the cell has been programmed to an "on" or to an "off" condition. Reading of the programmed state of the cell is accomplished by applying appropriate voltages to the source 120 and drain 140 regions of the cell and to the control gate 240 after which the amount of charge on floating gate 200 is sensed. To erase the contents of the cell, the programming process is reversed, that is charges are removed from the floating gate 200 by transferring the charges back to the substrate 10 through the gate oxide 180. Electron tunneling occurs through the oxide regions 300 and 320 that have been highlighted in the cross section of FIG. 5.

The programming and erasing of an EEPROM cell is accomplished electrically by using the familiar Fowler-Nordboirn (F-N) tunneling effect. During programming, a sufficiently high voltage is applied go to the control gate 240 and the drain 140 while the source 120 is grounded, creating a flow of electrons in the channel region 160 in the substrate 10. Some of these electrons gain enough energy to transfer from the substrate 10 to the floating gate 200 through the thin gate oxide layer 180 by means of Fowler-Nordheim tunneling. As the electron charge increases on the floating gate 200, the electric field between the control gate 240 and the drain 140 is reduced, which reduces the electron flow. Of importance in the tunneling region 300 and 320 is the quality and the thinness of the tunneling oxide 180 separating the floating gate 200 from the substrate 10. Inadvertent reverse tunneling, or erasure, for example, may occur if the tunnel oxide 180 is degraded, or other barriers to reverse tunneling are not formed in a split-gate flash memory cell.

A sidewall spacer (not shown) is typically provided over the exposed surface of the control gate 240 where this control gate does not overly the floating gate 200.

For the creation of the split-gate flash memory cell that is shown in cross section in FIG. 5, the Vss source region 120 is first impurity implanted into the surface of substrate 10. A thin layer 180 of gate oxide is then formed over the surface of substrate 10 by either thermal oxidation or by a deposition process. The thin layer 180 of gate oxide essentially forms the tunneling layer of the memory cell. The floating gate 200 of a first conductivity type, typically comprising polysilicon, is then formed over the surface of the layer 180 of gate oxide. The pattern for the floating gate 200 is defined by a thick layer of oxide which is formed in similarity with the formation of a layer of LOCOS oxide.

The floating gate 200 is next covered with a layer 220 of inter-poly dielectric which forms the separation between the floating gate 200 and a thereover created control gate 240. For this layer 220 of spacer dielectric, a layer of Oxide/Nitride/Oxide (ONO) is frequently applied. The control gate 240, of a second conductivity type, is then formed overlying the layer 220 of spacer dielectric.

Where the cross section of FIG. 5 shows a split-gate flash memory device having a single floating gate and a single control gate, such a structure is conventionally and readily combined to form the structure that is shown in cross section in FIG. 6.

The cross section of FIG. 6 is shown to highlight that two floating gates 20' and 20", having surfaces 26' and 26", are symmetrically arranged adjacent to a commonly shared source region 120 while two control gates 24' and 24" are aligned with the two floating gates 20' and 20" and have each been provided with a drain region, highlighted as regions of impurity concentration 14' and 14" in the surface of substrate 10.

Operational details and details of creation of the structure that is shown in cross section in FIG. 6 can readily be derived from and do not deviate from the description that has been provided for the cross section of FIG. 5.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating stacked layers of polysilicon, comprising:
   providing a substrate;
   patterning a first layer of polysilicon over said substrate;
   depositing a second layer of polysilicon over said substrate, thereby including the patterned first layer of polysilicon; and
   etching said second layer of polysilicon, thereby removing remnants of the second layer of polysilicon from sidewalls of the patterned first layer of polysilicon;
   wherein said etching said second layer of polysilicon comprises a break-through etch (BT), a main etch (ME), an over etch (OE) and a flash-etch.

2. The method of claim 1, said BT comprising a pressure of between about 3 and 5 mTorr, source power between about 200 and 300 Watt, bias power between about 100 and 200 Watt, etchant gas $Cl_2$ supplied at between about 80 and 100 sccm, applied for a time of between about 8 and 12 seconds.

3. The method of claim 1, said ME comprising a pressure of between about 5 and 7 mTorr, source power between about 200 and 300 Watt, bias power between about 100 and 200 Watt, etchant gas $Cl_2$ supplied at between about 25 and 35 sccm with HBr supplied at between about 80 and 100 sccm with an OE of about 15%.

4. The method of claim 1, said OE comprising a pressure of between about 50 and 70 mTorr, source power between about 200 and 300 Watt, bias power between about 150 and 220 Watt, etchant gas HBr supplied at between about 150 and 250 scan with He supplied at about 80 to 120 sccm, with $He$—$O_2$ supplied at about 3.0 sccm.

5. The method of claim 1, said flash step comprising a pressure of between about 50 and 70 mTorr, source power between about 100 and 200 Watt, etchant gas $SF_6$ supplied at between about 40 and 60 sccm with He supplied at about 150 to 250 sccm, applied for between about 10 and 20 sec.

6. A method for creating stacked layers of gate material for mixed-mode semiconductor devices, comprising:
   providing a substrate;
   creating a layer of gate oxide over said substrate;
   depositing a first layer of gate material over said layer of gate oxide;
   patterning and first etching said layer of first sate material;
   depositing a layer of inter-polysilicon dielectric material over said substrate, thereby including exposed surfaces of said first etched layer of first gate material;
   depositing a second layer of gate material over said layer of inter-polysilicon dielectric material; and
   patterning and second etching said second layer of gate material;
   wherein said patterning and second etching said second layer of gate material comprises the steps of a breakthrough etch (BT), a main etch (ME), an over etch (OE) and a flash etch.

7. The method of claim 6, said first layer of gate material comprising polysilicon.

8. The method of claim 6, said second layer of gate material comprising polysilicon.

9. The method of claim 6, said inter-polysilicon dielectric material comprising oxide based material.

10. The method of claim 6, said BT comprising a pressure of between about 3 and 5 mTorr, source power between about 200 and 300 Watt, bias power between about 100 and 200 Watt, etchant gas $Cl_2$ supplied at between about 80 and 100 sccm, applied for a time of between about 8 and 12 seconds.

11. The method of claim 6, said ME comprising a pressure of between about 5 and 7 mTorr, source power between about 200 and 300 Watt, bias power between about 100 and 200 Watt, etchant gas $Cl_2$ supplied at between about 25 and 35 sccm with HBr supplied at between about 80 and 100 sccm with an OE of about 15%.

12. The method of claim 6, said OE comprising a pressure of between about 50 and 70 mTorr, source power between about 200 and 300 Watt, bias power between about 150 and 220 Watt, etchant gas HBr supplied at between about 150 and 250 sccm with He supplied at about 80 to 120 sccm, with $He$—$O_2$ supplied at about 3.0 sccm.

13. The method of claim 6, said flash step comprising a pressure of between about 50 and 70 mTorr, source power between about 100 and 200 Watt, etchant gas $SF_6$ supplied at between about 40 and 60 sccm with He supplied at about 150 to 250 seem, applied for between about 10 and 20 sec.

14. A method for creating stacked layers of polysilicon, comprising:
   providing a substrate, at least one patterned first layer of polysilicon having been created over said substrate;
   depositing a second layer of polysilicon over said substrate, thereby including the at least one patterned first layer of polysilicon; and
   etching said second layer of polysilicon, thereby removing remnants of the second layer of polysilicon from sidewalls of the at least one patterned first layer of polysilicon, said etching said second layer of polysilicon comprising a breakthrough etch (BT), a main etch (ME), an over etch (OE) and a flash etch.

15. The method of claim 14, said BT comprising a pressure of between about 3 and 5 mTorr, source power between about 200 and 300 Watt, bias power between about 100 and 200 Watt, etchant gas $Cl_2$ supplied at between about 80 and 100 sccm, applied for a time of between about 8 and 12 seconds.

16. The method of claim 14, said ME comprising a pressure of between about 5 and 7 mTorr, source power between about 200 and 300 Watt, bias power between about 100 and 200 Watt, etchant gas $Cl_2$ supplied at between about 25 and 35 sccm with HBr supplied at between about 80 and 100 sccm with an OE of about 15%.

17. The method of claim 14, said OE comprising a pressure of between about 50 and 70 mTorr, source power between about 200 and 300 Watt, bias power between about 150 and 220 Watt, etchant gas HBr supplied at between about 150 and 250 scam with He supplied at about 80 to 120 sccm, with $He-O_2$ supplied at about 3.0 sccm.

18. The method of claim 14, said flash step comprising a pressure of between about 50 and 70 mTorr, source power between about 100 and 200 Watt, etchant gas $SF_6$ supplied at between about 40 and 60 sccm with He supplied at about 150 to 250 sccm, applied for between about 10 and 20 sec.

19. A method for creating stacked layers of polysilicon for mixed-mode semiconductor devices, comprising:
providing a substrate;
creating a layer of gale oxide over a surface of said substrate;
depositing a first layer of gate material over said layer of gate oxide;
patterning and first etching said layer of first gate material;
depositing a layer of inter-polysilicon dielectric material over the surface of said substrate, thereby including exposed surfaces of said first etched layer of first gate material;
depositing a second layer of gate material over a surface of said layer of inter-polysilicon dielectric material; and
patterning and second etching said second layer of gate material, said patterning and second etching said second layer of gate material comprising a break-through etch (BT), a main etch (ME), an over etch (OE) and a flash etch step.

20. The method of claim 19, said first layer of gate material comprising polysilicon.

21. The method of claim 19, said second layer of gate material comprising polysilicon.

22. The method of claim 19, said inter-polysilicon dielectric material comprising oxide based material.

23. The method of claim 19, said BT comprising a pressure of between about 3 and 5 mTorr, source power between about 200 and 300 Watt, bias power between about 100 and 200 Watt, etchant gas $Cl_2$ supplied at between about 80 and 100 sccm, applied for a time of between about 8 and 12 seconds.

24. The method of claim 19, said ME comprising a pressure of between about 5 and 7 mTorr, source power between about 200 and 300 Watt, bias power between about 100 and 200 Watt, etchant gas $Cl_2$ supplied at between about 25 and 35 sccm with HBr supplied at between about 80 and 100 sccm with an OE of about 15%.

25. The method of claim 19, said OE comprising a pressure of between about 50 and 70 mTorr, source power between about 200 and 300 Watt, bias power between about 150 and 220 Watt, etchant gas HBr supplied at between about 150 and 250 sccm with He supplied at about 80 to 120 sccm, with $He-O_2$ supplied at about 3.0 scam.

26. The method of claim 19, said flash step comprising a pressure of between about 50 and 70 mTorr, source power between about 100 and 200 Watt, etchant gas $SF_6$ supplied at between about 40 and 60 sccm with He supplied at about 150 to 250 sccm, applied for between about 10 and 20 sec.

* * * * *